United States Patent
Anthes et al.

(10) Patent No.: US 6,756,137 B2
(45) Date of Patent: Jun. 29, 2004

(54) VAPOR-DEPOSITION MATERIAL FOR THE PRODUCTION OF HIGH-REFRACTIVE-INDEX OPTICAL LAYERS, AND PROCESS FOR THE PRODUCTION OF THE VAPOR-DEPOSITION MATERIAL

(75) Inventors: Uwe Anthes, Erbach (DE); Martin Friz, Alsbach (DE)

(73) Assignee: Merck Patent GmbH, Darmstadt (DE)

( * ) Notice: Subject to any disclaimer, the term of this patent is extended or adjusted under 35 U.S.C. 154(b) by 35 days.

(21) Appl. No.: 10/028,980

(22) Filed: Dec. 28, 2001

(65) Prior Publication Data

US 2002/0102412 A1 Aug. 1, 2002

(30) Foreign Application Priority Data

Dec. 29, 2000 (DE) .......................................... 100 65 647

(51) Int. Cl.$^7$ .......................... B32B 15/00; C01G 23/04
(52) U.S. Cl. ........................ 428/697; 428/702; 428/432; 427/164; 427/166; 427/255.32; 423/609; 501/134; 501/152
(58) Field of Search ................................ 428/432, 697, 428/702; 427/164, 166, 255.32; 423/609; 501/134, 152

(56) References Cited

U.S. PATENT DOCUMENTS 5,340,607 A 8/1994 Friz et al.

6,327,087 B1 12/2001 Hashimoto et al.

FOREIGN PATENT DOCUMENTS

| DE | 4208811 | | 9/1993 | |
|---|---|---|---|---|
| EP | 1008868 | | 6/2000 | |
| JP | 11264068 | * | 9/1999 | ........... C23C/14/24 |

OTHER PUBLICATIONS

Chemical Abstracts, vol. 89, No. 10, (Sep. 4, 1978), Ohio, U.S.; abstract No. 83952y, Quill L L: "78—Inorganic Chemicals And Reactions"—XP002195735.

Bazuev et al: "Synthesis And X–Ray Diffraction Studies Of Phases Of Variable Composition LN2/3TIO3+Y With Perovskite Structure" ZH. NEORG. KHIM., Bd. 23, Nr. 6, 1978, Seiten 1451–1455, XP008002423.

* cited by examiner

*Primary Examiner*—Deborah Jones
*Assistant Examiner*—Ling Xu
(74) *Attorney, Agent, or Firm*—Millen, White, Zelano & Branigan, P.C.

(57) ABSTRACT

A vapor-deposition material for the production of high-refractive-index optical layers of titanium oxide, titanium and lanthanum oxide under reduced pressure comprising a sintered mixture having the composition $TiO_x + z*La_2O_3$, where $x=1.5$ to $1.8$ and $z=10$ to $65\%$ by weight, based on the total weight of the mixture. The constituents of the mixture are in the range of 10 to 65% by weight of lanthanum oxide, 38 to 74% by weight of titanium oxide and 2 to 7% by weight of titanium.

9 Claims, No Drawings

VAPOR-DEPOSITION MATERIAL FOR THE PRODUCTION OF HIGH-REFRACTIVE-INDEX OPTICAL LAYERS, AND PROCESS FOR THE PRODUCTION OF THE VAPOR-DEPOSITION MATERIAL

The invention relates to a vapor-deposition material for the production of high-refractive-index optical layers of titanium oxide, titanium and lanthanum oxide under reduced pressure, and to a process for the production of the vapor-deposition material.

Oxide layers are widely used in industry, in particular in optics, as protective layers or for optical functional purposes. They serve as protection against corrosion and mechanical damage or for coating the surfaces of optical components and instruments, such as lenses, mirrors, prisms, objectives and the like. Furthermore, the oxide layers are employed for the production of high-, medium- and low-refractive-index optical layers for increasing or reducing reflection. The most important areas of application are the production of antireflection layers on spectacle lenses and camera lenses, for binoculars and optical components and optics for laser technology. Further applications are the production of layers having a particular refractive index and/or certain optical absorption properties, for example for interference mirrors, beam splitters, heat filters and cold-light mirrors.

DE 42 08 811 A1 discloses a vapor-deposition material for the production of high-refractive-index optical layers by vapor deposition coating of substrates under reduced pressure. The material is a compound of the formula $La_2Ti_2O_{7-x}$, where x=0.3 to 0.7, in particular a compound of the formula $La_2Ti_2O_{6.5}$. Vapor-deposition materials of this type are produced by mixing oxides of lanthanum and titanium as well as metallic titanium in the corresponding stoichiometric ratio, and sintering the mixture below the melting point in a high vacuum.

German Patent 1 228 489 discloses a process for the production of thin oxide layers which are virtually absorption-free in the visible wavelength region for optical purposes, in particular on glass substrates, by vapor deposition of oxidic and/or oxidisable substances under reduced pressure. The vapor-deposition may, if desired, be carried out in the presence of an oxidising atmosphere. One or more elements and/or oxides from the group consisting of the rare earths, including yttrium, lanthanum and cerium, are vapor-deposited with the oxidic and/or oxidisable substances. The starting substances here are evaporated as a mixture or separately from one another. The oxidic and/or oxidisable substances used are, inter alia, titanium and/or titanium oxide.

For the production of high-refractive-index layers which have an optical refractive index of around the value 2, the choice of suitable starting materials is limited. Possible starting materials for this purpose are essentially the oxides of titanium, zirconium, hafnium and tantalum, as well as mixed system thereof. A preferred starting material for high-refractive-index layers is titanium dioxide.

Besides titanium oxide, the prior art furthermore uses compounds such as tantalum oxide, zirconium oxide, hafnium oxide and zinc sulfide, and mixtures of oxides, for example zirconium oxide and titanium oxide, titanium oxide and praseodymium oxide, and titanium oxide and lanthanum oxide.

These substances have advantages. Titanium dioxide, for example, has a high refractive index, and hafnium oxide and zirconium oxide have low absorption. The disadvantages of these known substances, for example, are vigorous gas evolution and spitting of the titanium dioxides, relatively high absorption in the case of tantalum oxide $Ta_2O_5$ and a mixture of titanium oxide and praseodymium oxide, incomplete melting of zirconium oxide, hafnium dioxide and a mixture of zirconium oxide and titanium dioxide, and low hardness, for example, in the case of zinc sulfide. In a mixture of titanium oxide and lanthanum oxide, some of the advantages are, for example, low absorption, no gas evolution and spitting, and relatively good melting. However, the refractive index of a mixture of this type is significantly lower than in the case of titanium dioxide and zinc sulfide. From the practical processing point of view, it is also disadvantageous that these substances have high melting and boiling points, which in addition are relatively close to one another. In order to ensure a uniform and adequate evaporation rate, it is necessary for the vapor-deposition materials to be completely melted before commencement of significant evaporation. This condition is necessary in order for homogeneous and uniformly thick layers to form on the objects to be vapor deposition coated. However, this is not the case under use conditions for the oxides of zirconium and hafnium and in the case of titanium/zirconium mixed oxide systems. The said substances do not melt or do not melt completely under typical working conditions, they are difficult to evaporate completely, and thickness variations arise in the vapor-deposited layers. The aim in the prior art is to lower the melting points of the base materials by means of suitable additives, where these additives furthermore serve to vary the refractive index in the resultant layers within certain limits and to set the refractive index to a specific value. The choice of suitable additives for this purpose is restricted by the requirement for freedom from absorption. The only metal oxides suitable as corresponding additives are therefore those which have no absorptions in the visible spectral region as far as the near UV wavelength range, i.e. up to about 320 nm.

The said oxides have no or only slight absorption in the visible wavelength region, which is a basic prerequisite for optical applications. However, loss of oxygen and deposition of titanium oxide layers which are sub-stoichiometric with respect to the oxygen content occur during high-vacuum evaporation. This means that, the production of thin layers by vacuum evaporation with these materials results in layers having high absorption in the visible region without special precautionary measures. German Patent 1 228 489 addresses this problem by carrying out the evaporation in a vacuum with a certain residual oxygen pressure of from $5*10^{-5}$ to $<5*10^{-4}$ mbar, whereby an oxidising atmosphere is established. Another approach for solving this problem consists in subjecting the resultant layers to post-conditioning in oxygen or air.

Even if the above-mentioned problems can be solved through a suitable choice of additives or the choice of corresponding substance mixtures, the use of mixed systems is not preferred per se in vacuum vapor-deposition technology. The reason is that mixed systems generally evaporate incongruently, i.e. they change their composition during the evaporation process, and the composition of the deposited layers also changes correspondingly. This can be avoided if the mixed systems comprise discrete chemical compounds which evaporate and re-condense without material change.

Upon further study of the specification and appended claims, further objects and advantages of this invention will become apparent to those skilled in the art.

The object of the invention is to provide a vapor-deposition material from which optical layers having the highest possible refractive index and low absorption can be produced, where the vapor-deposition material exhibits very good melting and evaporation behavior and can be evaporated with virtually no evolution of gas or spitting.

This object is achieved in accordance with the invention in that the material is a sintered mixture of the composition $TiO_x + z^*La_2O_3$, where x=1.5 to 1.8 and z=10 to 65%, e.g., 10 to 60%, by weight, based on the total weight of the mixture.

Titanium oxide, $TiO_x$, for x=1.5 to 1.8 means titanium suboxide, i.e., a mixture with compounds having less oxygen than titanium dioxide, for example, but not limited to, $Ti_3O_5$ or $Ti_4O_7$, but not Ti.

In an embodiment of the invention, the mixture comprises from 19 to 65% by weight of lanthanum oxide, from 38 to 74% by weight of titanium oxide and from 2 to 7% by weight of titanium. In two specific embodiments of the invention, the mixture consists of 58.9% by weight of lanthanum oxide, 37.9% by weight of titanium oxide and 3.2% by weight of titanium and 63.2% by weight of lanthanum oxide, 33.9% by weight of titanium oxide and 2.9% by weight of titanium respectively.

In an embodiment of the invention, the ratio between titanium oxide $TiO_2$ and titanium determines the stoichiometry with respect to the oxygen in the titanium oxide $TiO_x$ for x=1.5 to 1.8. The titanium oxide: lanthanum oxide weight ratio here can be determined by admixing lanthanum oxide with the mixture of titanium oxide and titanium. By sintering under reduced pressure, it is ensured that the stoichiometry of the mixture with respect to the oxygen does not change. The vapor-deposition materials according to the invention have an oxygen deficit within the range of the formula definition given above compared with the base compound lanthanum titanate, which has a precise stoichiometric composition. Due to the intentional establishment of the oxygen deficit in the vapor-deposition materials according to the invention, no further release of oxygen, resulting in undesired spitting of the molten vapor-deposition materials, occurs during evaporation under reduced pressure. The selected range of the oxygen deficit is also affected such that absorption-free layers form automatically under the usual working conditions in the vacuum evaporation method. Even a relatively small added amount of lanthanum oxide can improve the behavior during melting and evaporation. The mixture according to the invention can be melted and evaporated in an electron-beam evaporator with virtually no spitting and evolution of gases by setting an optimum stoichiometry with respect to oxygen. It is found here that the optical properties of the resultant layers are virtually unaffected by variations in the residual oxygen pressure during the evaporation under reduced pressure. In comparison, spitting during melting cannot be completely prevented in the case of titanium(IV) oxide $TiO_2$ and in the case of titanium suboxides, such as $TiO_{1.7}$, $Ti_3O_5$ or $Ti_4O_7$. The refractive index of layers produced with the vapor-deposition material according to the invention is only slightly lower than in the case of pure titanium oxide layers. The refractive index, in particular, is significantly higher than in the case of layers of tantalum oxide, zirconium oxide, hafnium oxide or mixtures of oxides, such as zirconium oxide and titanium oxide, titanium oxide and praseodymium oxide, and titanium oxide and lanthanum oxide. The good melting behavior enables the establishment and maintenance of a flat melting surface for the evaporation of the vapor-deposition material. This enables the setting of a uniform, reproducible layer-thickness distribution on the substrates to be coated. The same is very difficult, or even impossible, by the use of materials which have worse melting behavior, such as, hafnium oxide, zirconium oxide, or a mixture of zirconium oxide and titanium oxide.

A further object of the invention is to provide a process which enables the production of vapor-deposition materials which can be converted into optical layers of high refractive index without spitting and without evolution of gases. This is achieved by a process in which a mixture of titanium oxide, titanium and lanthanum oxide having the composition $TiO_x + z^*La_2O_3$, where x=1.5 to 1.8 and z=10 to 65% by weight, based on the total weight of the mixture, is mixed homogeneously, granulated or tabletted to a particle size of about 1 to 4 mm, and subsequently sintered under reduced pressure. Sintering is carried out under a vacuum of about $1*10^{-4}$ mbar at a temperature of about 1500 to 1600° C. for a period of about 5½ to 6½ hours. A further object of the invention is to enable a process for the production of optical layers of high refractive index with substantial freedom from absorption from the vapor-deposition materials. This is achieved by a process in which the substrates to be coated are cleaned, dried and mounted on a substrate holder in a vapor-deposition unit, the pressure in the vapor-deposition unit is set to about $1*10^{-5}$ mbar, the substrates are heated to about 280 to 310° C., oxygen is added into the vapor-deposition unit until a pressure of about 1 to $2*10^{-4}$ mbar is reached, the vapor-deposition material is melted by an electron-beam evaporator in the vapor-deposition unit which is sealed off by a screen, and is heated to its evaporation temperature of about 2200 to 2300° C., the screen is opened, and the substrates are coated with the vapor-deposition material to a predetermined thickness. Optical layers of the vapor-deposition material having a refractive index of 2.15 to 2.25, in particular 2.20, at a wavelength of 500 nm are obtained. These type of optical layers are used as antireflection layers on spectacle lenses, lenses for optical instruments, optical components for laser technology and as layers of prespecified high refractive index and/or optical absorption properties for beam splitters, interference mirrors, cold-light mirrors and heat-protection filters.

The vapor-deposition materials of the invention enable the production of homogeneous, thin layers of uniform layer thickness which have strong adhesion and are particularly resistant to mechanical and chemical influences on suitable substrates. These layers have a high refractive index and generally have high transmission in a wavelength range from near UV, i.e. approximately from a wavelength of 360 nm, via the visible region into the near infrared to a wavelength of about 7000 nm. These optical layers are substantially free from absorption in the visible wavelength range.

The invention is demonstrated in greater detail below by two examples, but these examples do not in any way restrict the scope of the invention.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius; and, unless otherwise indicated, all parts and percentages are by weight.

The entire disclosure of all applications, patents and publications, cited above or below, and of corresponding German application No. 10065647.1, filed Dec. 29, 2000 is hereby incorporated by reference.

EXAMPLE 1

A mixture of 58.9% by weight of lanthanum oxide, 37.9% by weight of titanium oxide and 3.2% by weight of titanium is mixed homogeneously, granulated to a particle size of about 1–4 mm and is sintered under reduced pressure at about 1500° C. for 6 hours. The sintered product is deep black.

In order to produce optical layers, the sintered product is introduced into a molybdenum crucible in a vapor-deposition unit and is inserted into the unit's electron-beam evaporator. The substrates to be coated, quartz-glass discs, having a diameter of 25 mm and a thickness of 1 mm, are cleaned, dried and mounted on a substrate holder in the vapor-deposition unit. The vapor-deposition unit is a unit known from the prior art and is neither depicted in a drawing nor described in detail. After lowering the pressure to $1*10^{-5}$ mbar, the substrates are heated to a temperature of about 300° C. Oxygen is then admitted into the vapor-deposition unit via a control valve until a pressure of 1 to $2*10^{-4}$ mbar is reached. The vapor-deposition material is melted under a screen of the electron-beam evaporator and is heated to the evaporation temperature of 2200° C. As soon as this evaporation temperature is reached, the screen is opened, and the substrates are coated with an optical layer of the desired thickness. After cooling, the coated substrates are removed from the vapor-deposition unit. The transmission of the layers is determined using a spectrophotometer. The refractive index of 2.20 at a wavelength of 500 nm is determined from the transmission curve. The layer thickness is 267 nm.

EXAMPLE 2

A mixture of 63% by weight of lanthanum oxide, 34% by weight of titanium oxide and 3% by weight of titanium is mixed homogeneously, granulated to a particle size of about 1–4 mm and is sintered under reduced pressure at about 1500° C. for 6 hours. The sintered product is deep black.

Optical layers of the sintered vapor-deposition material are produced in the same way as described in Example 1. The refractive index of these optical layers is 2.16 at a wavelength of 500 nm. The thickness of the optical layers is 271 nm. The layers exhibits no absorption in the visible region and up to a wavelength of 900 nm.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. A vapor-deposition material, comprising a sintered mixture of 58.9 wt % lanthanum oxide, 37.9 wt % titanium dioxide and 3.2 wt % titanium, that is deposited by vapor deposition to form said vapor-deposition material.

2. A vapor-deposition material according to claim 1, wherein the mixture comprises particles having sizes of 1 to 4 mm.

3. A substrate having an optical layer comprising a vapor-deposition material according to claim 1.

4. A substrate having an optical layer according to claim 3, which has a refractive index of 2.15 to 2.25 at a wavelength of 500 nm.

5. A substrate having an optical layer according to claim 4, which has a refractive index of 2.20 at a wavelength of 500 nm.

6. A spectacle lens, a lens for optical instruments, an optical component for laser technology, a beam splitter, an interference mirror, a cold-light mirror or a heat protection filter comprising an optical layer according to claim 3.

7. A process for the preparation of a vapor-deposition material according to claim 1, comprising mixing homogeneously the mixture of claim 4, granulating or tabbletting said mixture to particles having a particle size of 1 to 4 mm, and sintering said particles under reduced pressure.

8. A process according to claim 7, wherein the sintering is carried cut at a pressure of about $10^{-4}$ mbar at a temperature of about 1500 to 1600° C. over a period of about 5.5 to 6.5 hours.

9. A process for the preparation of a substrate having an optical layer, comprising cleaning, drying, and mounting a substrate on a substrate holder in a vapor-deposition unit, lowering the pressure in the vapor-deposition unit to $10^{-5}$ mbar, heating the substrate to 280 to 310° C., adding oxygen into the vapor-deposition unit until the pressure reaches 1 to $2*10^{-4}$ mbar, melting a vapor-deposition material comprising a sintered mixture according to claim 1, in an electron-beam evaporator in the vapor-deposition unit which is sealed off by a screen, heating the said vapor-deposition material to its evaporation temperature of about 2200 to 2300° C., and opening the screen whereby the substrates are coated with the vapor-deposition material to a predetermined thickness.

* * * * *